United States Patent
Ishimura et al.

(10) Patent No.: US 7,224,568 B2
(45) Date of Patent: May 29, 2007

(54) PLASMA PROCESSING METHOD AND PLASMA PROCESSING APPARATUS

(75) Inventors: Hiroaki Ishimura, Kudamatsu (JP); Ken Yoshioka, Hikari (JP); Takahiro Abe, Hofu (JP); Go Saito, Hikari (JP); Motohiko Yoshigai, Hikari (JP)

(73) Assignee: Hitachi High-Technologies Corporation, Tokyo (JP)

( * ) Notice: Subject to any disclaimer, the term of this patent is extended or adjusted under 35 U.S.C. 154(b) by 25 days.

(21) Appl. No.: 11/069,551

(22) Filed: Mar. 2, 2005

(65) Prior Publication Data

US 2006/0171093 A1 Aug. 3, 2006

(30) Foreign Application Priority Data

Jan. 28, 2005 (JP) ............................. 2005-022112

(51) Int. Cl.
*H01L 21/683* (2006.01)

(52) U.S. Cl. ..................................................... 361/234

(58) Field of Classification Search ................. 361/234
See application file for complete search history.

(56) References Cited

U.S. PATENT DOCUMENTS 5,737,177 A * 4/1998 Mett et al. .................. 361/234
6,596,550 B2 * 7/2003 Sill et al. ...................... 438/10

* cited by examiner

*Primary Examiner*—Brian Sircus
*Assistant Examiner*—Lucy Thomas
(74) *Attorney, Agent, or Firm*—Antonelli, Terry, Stout & Kraus, LLP.

(57) ABSTRACT

In a plasma processing apparatus using electrostatic chuck, increase of plasma potential is prevented and abnormal discharge is avoided. The plasma processing apparatus comprises an RF source for generating plasma in a vacuum container, another RF source for applying an RF bias power to a sample, a sample stage having an electrostatic chuck electrode, a DC power supply for applying an electrostatic chuck voltage to the electrode, and a controller for shifting the electrostatic chuck voltage to negative by a potential difference of quarter to half of peak-to-peak voltage of the RF bias power for suppressing increase of plasma potential.

12 Claims, 6 Drawing Sheets

PLASMA PROCESSING METHOD AND PLASMA PROCESSING APPARATUS

The present application is based on and claims priority of Japanese patent application No. 2005-022112 filed on Jan. 28, 2005, the entire contents of which are hereby incorporated by reference.

BACKGROUND OF THE INVENTION

1. Field of the invention

The invention relates to a plasma processing method and plasma processing apparatus for a sample, the method and apparatus being suitable to suppressing damage, due to increase of plasma potential, to the inner wall of a vacuum process container of a semiconductor surface processing apparatus utilizing plasma such as a plasma etching apparatus.

2. Description of the related art

A method of holding an object with electrostatic action is used, in particular, to transfer a wafer in a semiconductor manufacturing apparatus, and to fix a wafer during various processes. As compared to mechanical holding methods using clamps or the like, the method using electrostatic force, known as electrostatic chuck, has more advantages such as being free from wafer contamination due to contact and easy to control wafer temperature because the wafer is attached with the entire surface of its rear side. In this way, electrostatic chuck has many advantages as a method of holding a wafer. For this reason, it is widely used for wafer processing electrodes in dry etcher, CVD or other apparatus. In general, electrostatic chuck systems include the monopole configuration that typically provides a single electrode subjected to a chuck voltage, and the dipole configuration that provides two or more electrodes subjected to chuck voltages with generally different polarities.

In the conventional art described above, a processing apparatus for plasma etching a semiconductor wafer, for example, has the following problems. As processed devices continue to shrink in recent years, there arises the need to eliminate as much of trace heavy metals contaminated in the processing plasma as possible. In this respect, surface insulating material such as high-purity quartz, alumina ceramics, or surface anodized aluminum is widely used instead of conventional conductive material such as SUS. More specifically, the inner wall surface of the process container exposed to plasma is typically covered with insulating material having high plasma resistance, which allows plasma in the process container to be nearly floating with respect to direct current. In this environment, for the purpose of electrostatic chuck, a positive chuck voltage, for example, is applied to the electrode for mounting a semiconductor wafer, and plasma is generated for processing the semiconductor wafer. Minute DC leak current then flows into the plasma (electrons flow out of the plasma) via a dielectric coating on the electrode surface and the semiconductor wafer, and consequently charges up the plasma to a higher positive potential.

Various factors are relevant to the value of the leak current. It is known that the leak current significantly depends on the potential difference between the potential of the wafer surface (negatively charged by injection of electrons from the plasma) and the potential on the output side of the electrostatic chuck power supply. When the positive charge up of the plasma is advanced by the leak current and the plasma potential exceeds a certain level, dielectric breakdown of the insulator layer on the inner wall surface of the process container may cause spark-like abnormal discharge, for example, on a portion of the inner wall surface of the process container, particularly on the surface of anodized aluminum material. Such abnormal discharge may affect the discharge stability of plasma. In addition, metal particles scattered by the abnormal discharge may lead to the increase of device defects and metal contamination of the semiconductor wafer.

The foregoing phenomenon is an example where a positive chuck voltage is applied in the monopole configuration. On the other hand, in the dipole configuration, two electrically isolated electrodes, for example, are subjected to voltages of different polarities (e.g., +500 V and −500 V), respectively, for electrostatic chuck action. As with the monopole configuration, leak current occurs from the positive voltage electrode to the plasma. In the same manner as in the monopole configuration, the wafer surface is negatively charged by electrons supplied from the plasma. The value of leak current flowing from the plasma to the negative electrode via the dielectric layer is smaller than that flowing from the positive electrode to the plasma. This advances charge up of the plasma to a higher positive potential and increases the plasma potential, which eventually leads to dielectric breakdown of the insulator layer on the inner wall surface of the chamber.

SUMMARY OF THE INVENTION

An object of the invention is to provide a processing method and processing apparatus for a sample, the method and apparatus being capable of suppressing damage, due to the excessive increase of plasma potential, to the process container of the chamber.

The foregoing object is achieved by a plasma processing apparatus for generating plasma in a vacuum container and processing a sample with the plasma in which the sample placed on a sample stage is electrostatically chucked on the sample stage in a monopole or dipole configuration, wherein the voltage of the electrostatic chuck is shifted for suppressing the increase of plasma potential of the plasma.

More specifically, the invention provides a plasma processing method for a plasma processing apparatus including a first RF source for generating plasma in a vacuum container, a second RF source for applying an RF bias power to a sample, a sample stage having at least one electrostatic chuck electrode for electrostatic chucking the sample, and a DC power supply for applying at least one electrostatic chuck voltage to the electrode, the method comprising varying the electrostatic chuck voltage to negative for suppressing increase of plasma potential of the plasma. In an aspect of the plasma processing method according to the invention, the electrostatic chuck voltage is shifted to negative by a potential difference of quarter to half of peak-to-peak voltage of the RF bias power. In another aspect of the plasma processing method according to the invention, the electrostatic chuck voltage is shifted according to a monitored result of the peak-to-peak voltage of the RF bias power or a recipe setting of the voltage shift. In still another aspect of the plasma processing method according to the invention, the at least one electrode placed at the sample stage is in one of a monopole configuration and a dipole configuration, and when the at least one electrode is in the dipole configuration, the at least one electrostatic chuck voltage is shifted to negative by 50 to 500 V for both the electrodes. In yet another aspect of the plasma processing method according to the invention, a surface surrounding the plasma in the plasma processing apparatus is surrounded by an insulating member, or surrounded by an insulating member and partly by a conductive member.

The invention provides a plasma processing apparatus comprising a first RF source for generating plasma in a vacuum container, a second RF source for applying an RF bias power to a sample, a sample stage having at least one electrostatic chuck electrode for electrostatic chucking the sample, a DC power supply for applying at least one electrostatic chuck voltage to the electrode, and a controller for varying the electrostatic chuck voltage to negative for suppressing increase of plasma potential of the plasma. In an aspect of the invention, the controller controls the electrostatic chuck voltage so that the electrostatic chuck voltage is shifted to negative by a potential difference of quarter to half of peak-to-peak voltage of the RF bias power, and the controller shifts the electrostatic chuck voltage according to a monitored result of the peak-to-peak voltage of the RF bias power or a recipe setting of the voltage shift. In another aspect of the plasma processing apparatus according to the invention, the at least one electrode placed at the sample stage is in one of a monopole configuration and a dipole configuration, and when the at least one electrode is in the dipole configuration, the controller shifts the at least one electrostatic chuck voltage to negative by 50 to 500 V for both the electrodes. In still another aspect of the plasma processing apparatus according to the invention, a surface surrounding the plasma in the plasma processing apparatus is surrounded by an insulating member, or surrounded by an insulating member and partly by a conductive member.

DETAILED DESCRIPTION OF THE PREFERRED EMBODIMENTS

Figure 1:
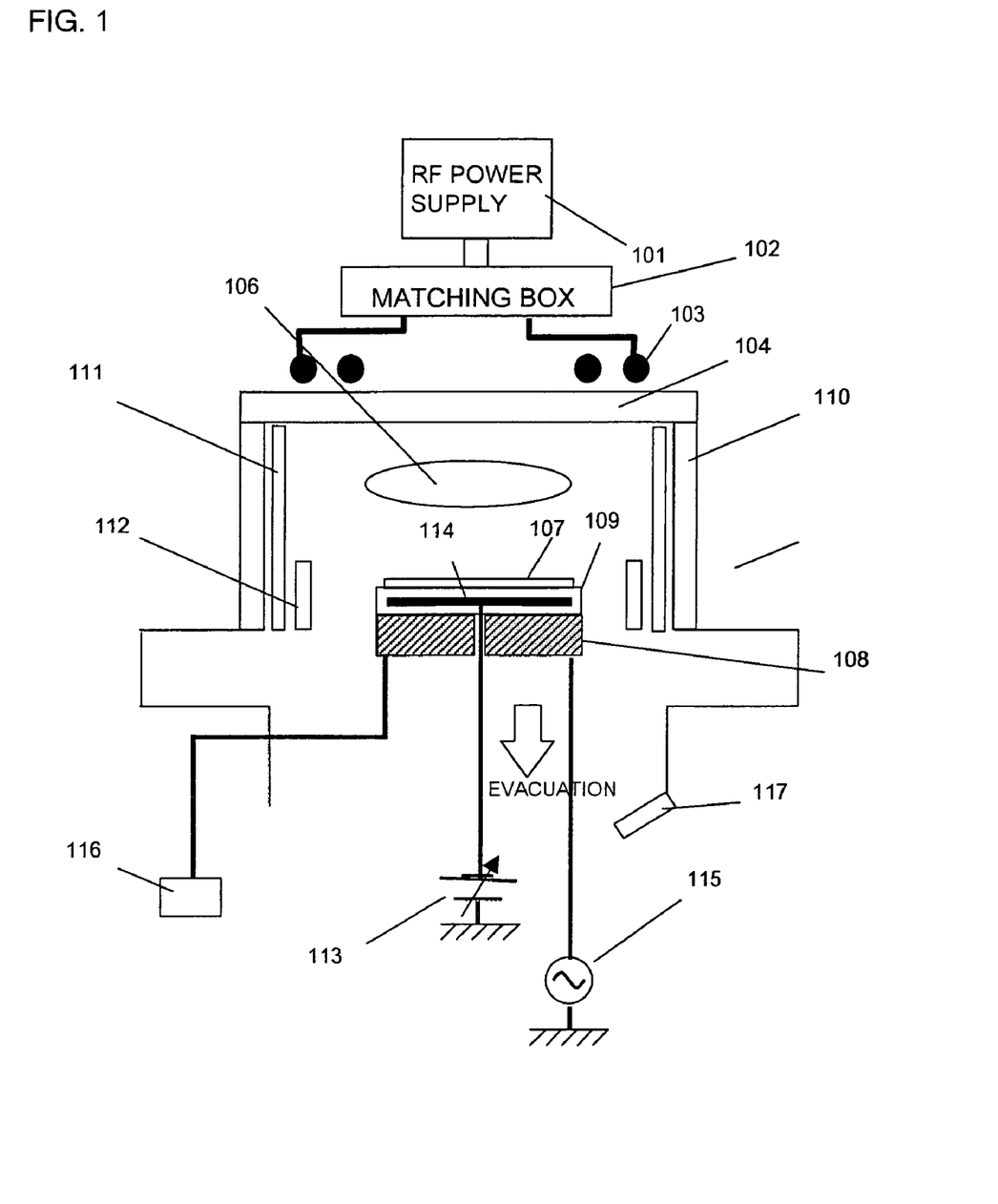
FIG. 1 is a detailed view of a plasma processing apparatus of a first embodiment of the invention.

A plasma processing apparatus and processing method according to the invention will now be described with reference to FIGS. 1 to 8. FIG. 1 is a detailed view of a plasma generator of the plasma processing apparatus to which a first embodiment of the invention is applied. This embodiment shows an example of inductively coupled plasma generated by plasma generating means having an induction antenna. In the invention described in this embodiment, the plasma generating means may be means for generating inductively coupled plasma, or means for generating other type of commonly used plasma such as magnetized microwave plasma.

In this plasma processing apparatus, an RF wave is introduced from an RF power supply 101 via a matching box (coaxial cable) 102, an antenna 103, and an inductive coupling window (e.g., quartz plate) 104 into a vacuum container 110. The vacuum container 110 is covered with a cylinder 111 of quartz, alumina, or anodized aluminum material. On its inside is placed a ground electrode 112 made of metal having a surface sprayed with a dielectric coating or made of anodized metal. The apparatus is configured so that the RF wave introduced into the vacuum container through the inductive coupling window 104 generates plasma 106 through the inductive coupling effect. For example, a sample 107 having a diameter of 200 mm or 300 mm is placed on a sample stage 108 and electrostatically chucked together with a dielectric coating 109 by a DC voltage applied to an electrode 114 by a DC power supply 113. The sample stage for electrostatically chucking the dielectric coating 109 and the sample 107 is thus an electrostatic chuck sample stage in the so-called monopole configuration. The sample stage 108 is connected with an RF power supply 115 that can be continuously or periodically switched on and off, and a heat medium temperature controller 116 for adjusting the temperature of the sample stage 108. In a lower portion of the vacuum container 110 is placed a view port 117, through which the discharge state of the plasma can be observed.

Figure 2:
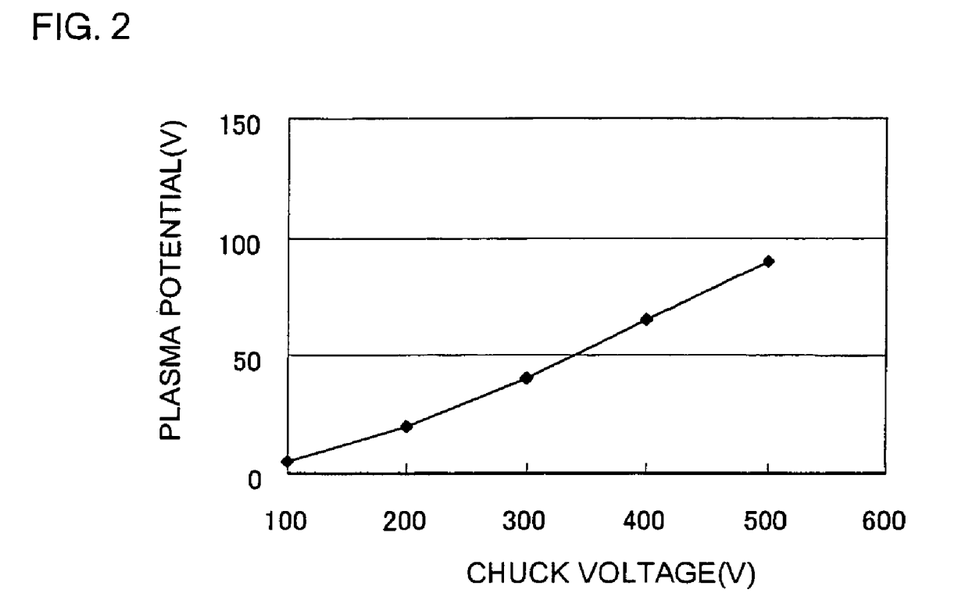
FIG. 2 shows an example measurement of plasma potential versus chuck voltage measured in the apparatus shown in FIG. 1.

The etching apparatus described above was used to conduct experiments for examining the correlation between the electrostatic chuck voltage and the plasma potential. The plasma potential was measured by a DC probe while examining the voltage applied to the electrode 114 from the positive DC power supply 113. As shown in FIG. 2, it was found that the plasma potential increases as the voltage applied to the electrode 114 increases. Simultaneous observations of the inside of the vacuum container through the view port 117 revealed that abnormal discharge is likely to occur at plasma potentials above 50 V.

Figure 3:
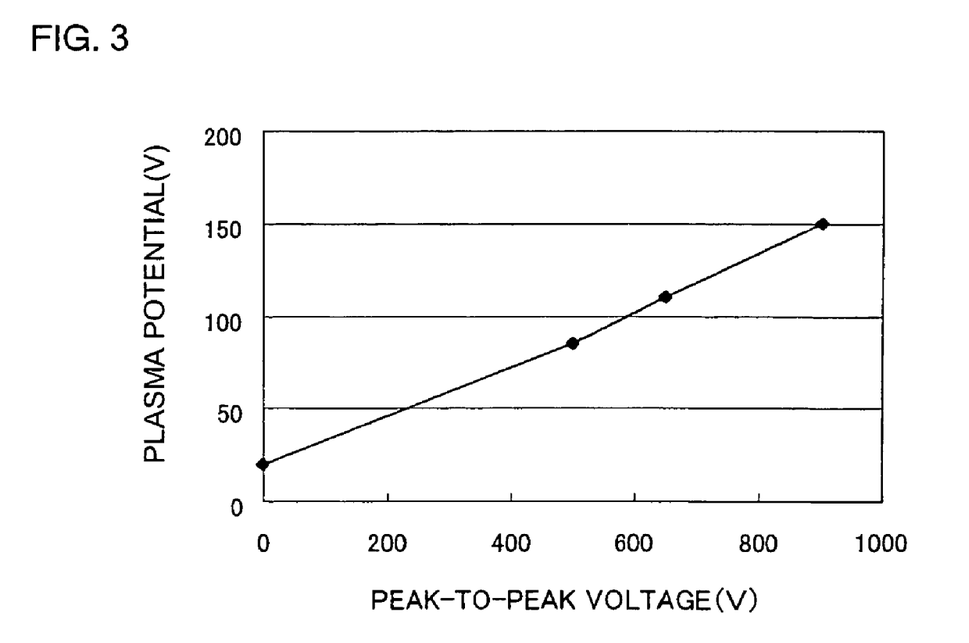
FIG. 3 shows an example measurement of plasma potential versus peak-to-peak voltage measured in the apparatus shown in FIG. 1.

Next, the power (peak-to-peak voltage) of the RF power supply 115 applied to the sample stage 108 was varied to measure the plasma potential versus the peak-to-peak voltage of the RF power supply 115. As described earlier, the value of the leak current depends on the wafer surface potential. On the other hand, the potential of the wafer surface significantly depends on the peak-to-peak voltage. As a result, the change of the peak-to-peak voltage causes the change of the leak current value and, in turn, of the plasma potential. Measurements revealed that, as shown in FIG. 3, the plasma potential tends to be higher as the peak-to-peak voltage increases. As can be seen from FIG. 3, the value of the chuck voltage appropriate for suppressing the abnormal discharge due to the increase of plasma potential depends on the value of the peak-to-peak voltage.

It was found from experiments that the plasma potential can be held down below 50 V and abnormal discharge can be avoided with a sufficient margin when the chuck voltage has a value shifted to negative by about quarter to half of the value of the peak-to-peak voltage relative to a reference chuck voltage. For example, when the reference chuck voltage is +500 V and the peak-to-peak voltage is 600 V, the chuck voltage was shifted to negative by 200 V to be +300 V. The above apparatus may be provided with a control circuit capable of changing the chuck voltage in association with the peak-to-peak voltage so that abnormal discharge can be automatically suppressed.

It is contemplated that the above phenomenon occurs by the following mechanism. The DC potential applied to the electrode for the purpose of electrostatic chuck could cause a direct current of about 0.1 to 1 mA to flow between the sample 107 and the plasma 106. However, when the inside of the plasma process container is made of insulating material, the direct current cannot be sufficiently absorbed on the ground side, which results in increase of the plasma potential. If the wall inside the process container includes relatively thin insulating material such as anodized aluminum, the thin material is subjected to a difference voltage between the plasma potential and the ground potential (typically 0 V), which exerts a strong electric field strength on the insulating material. For example, for a plasma potential of 80 V and a thickness of the insulating material of 20 $\mu$m, the material is subjected to an electric field strength of $4 \times 10^6$ V/m. It is contemplated that this electric field causes dielectric breakdown, observed as abnormal discharge.

The increase of plasma potential can be avoided by reducing the direct current flowing from the electrode 114. It is known that the surface of the sample subsides into the negative voltage with respect to direct current when a bias voltage is applied to the sample by an RF power supply. The inventors have found that this subsidence accounts for about quarter to half of the peak-to-peak voltage. The amount of this subsidence depends on various factors such as the effective area of the ground electrode 112 and the frequency of the power supply. The direct current flowing through the electrode is determined by the difference between the negatively subsiding voltage of the sample surface and the DC voltage applied to the sample stage. The inventors have recognized that it is preferable to reduce this difference. This approach can be used to subtract a desired value of DC voltage from the applied voltage, although the appropriate value depends on the structure and type of the apparatus. In this situation, since the sample surface subsides into negative, a sufficient force of electrostatic chuck can be obtained in spite of the subtraction for the DC voltage applied to the electrostatic chuck electrode.

Consequently, the invention provides a control circuit for automatically detecting the peak-to-peak voltage and applying a voltage obtained by subtracting quarter to half of the voltage from the original value of DC voltage. Alternatively, when an expected value of the peak-to-peak voltage is known in advance, an associated electrostatic chuck voltage can be set to a recipe for each etching step to avoid abnormal discharge.

Figure 4:
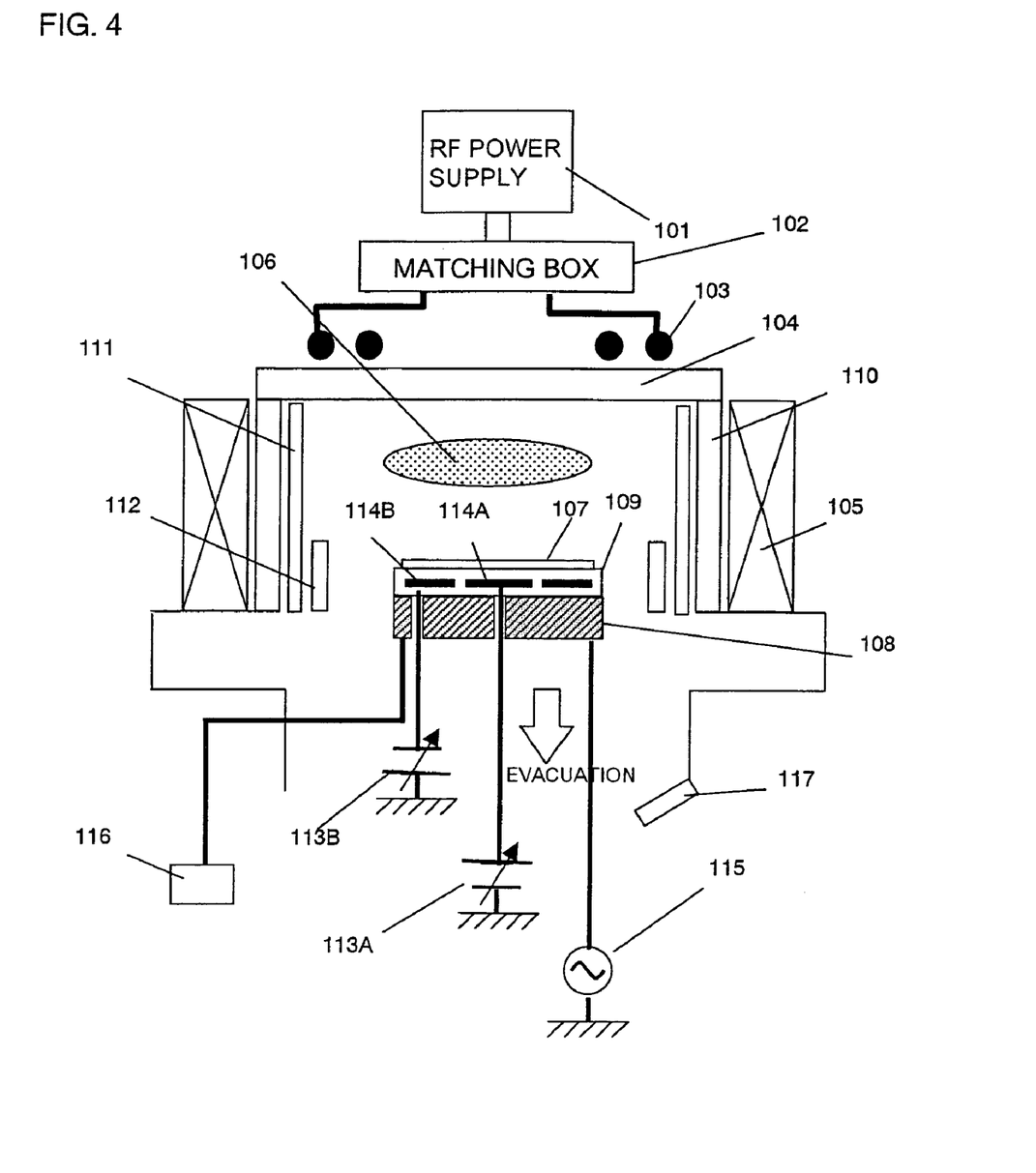
FIG. 4 is a detailed view of a plasma processing apparatus of a second embodiment of the invention.

Next, a second embodiment of the invention will be described. FIG. 4 is a detailed view of a plasma generator of the plasma processing apparatus to which the invention is applied. The plasma generating means in this embodiment is the same as that shown in FIG. 1. This embodiment is different from that shown in FIG. 1 in that the electrode 114 provided at the sample stage 108 for electrostatic chuck is divided into an inner electrode 114A and an outer electrode 114B, which are subjected to DC voltages of different directions applied from DC power supplies 113A and 113B, respectively. For example, a sample 107 having a diameter of 200 mm or 300 mm is placed on the sample stage 108 and electrostatically chucked together with a dielectric coating 109 by a positive DC voltage applied to the inner electrode 114A by the DC power supply 113A and a negative DC voltage applied to the outer electrode 114B by the DC power supply 113B. The sample stage is thus an electrostatic chuck sample stage in the so-called dipole configuration. The sample stage 108 is connected with an RF power supply 115 and a heat medium temperature controller 116 for adjusting the temperature of the sample stage 108 as with FIG. 1.

Figure 5:
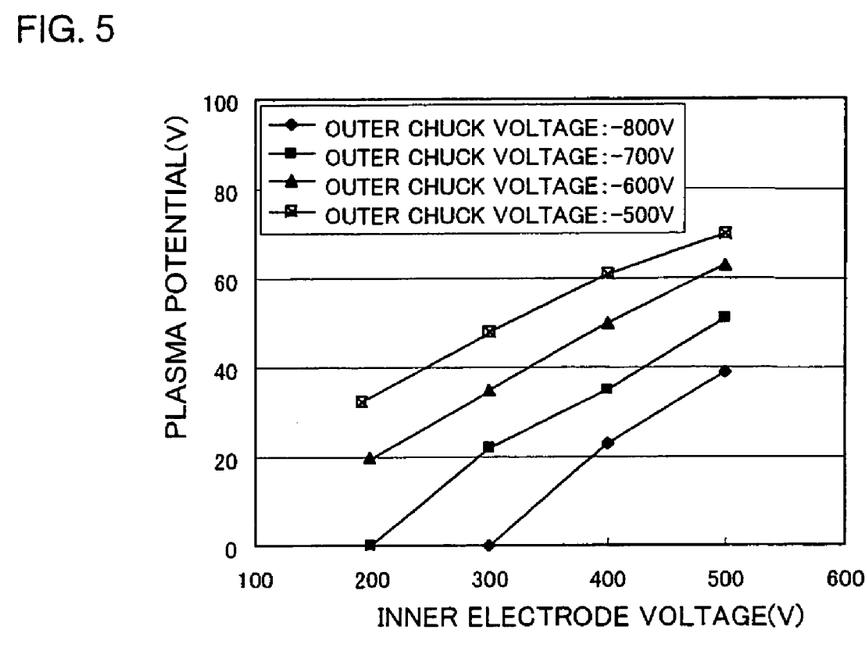
FIG. 5 shows an example measurement of plasma potential versus inner electrode voltage parameterized by outer chuck voltage measured in the apparatus shown in FIG. 4.

The etching apparatus described above was used to conduct experiments for examining the correlation between the electrostatic chuck voltage and the plasma potential. In this assessment, HBr and $O_2$ gases were introduced into the vacuum container 110. The power of the RF power supply 101 was set to 500 W, and the power of the RF power supply 115 applied to the sample stage was set to 35 W. The plasma potential was measured by a DC probe while examining the relationship between the voltage applied to the inner electrode 114A from the positive DC power supply 113A and the voltage applied to the outer electrode 114B from the negative DC power supply 113B. As shown in FIG. 5, it was found that the plasma potential increases as the voltage applied to the inner electrode 114A increases and as the absolute value of the voltage applied to the outer electrode 114B decreases. Simultaneous observations of the inside of the vacuum container through the view port 117 revealed that abnormal discharge is likely to occur at plasma potentials above 50 V.

Figure 6:
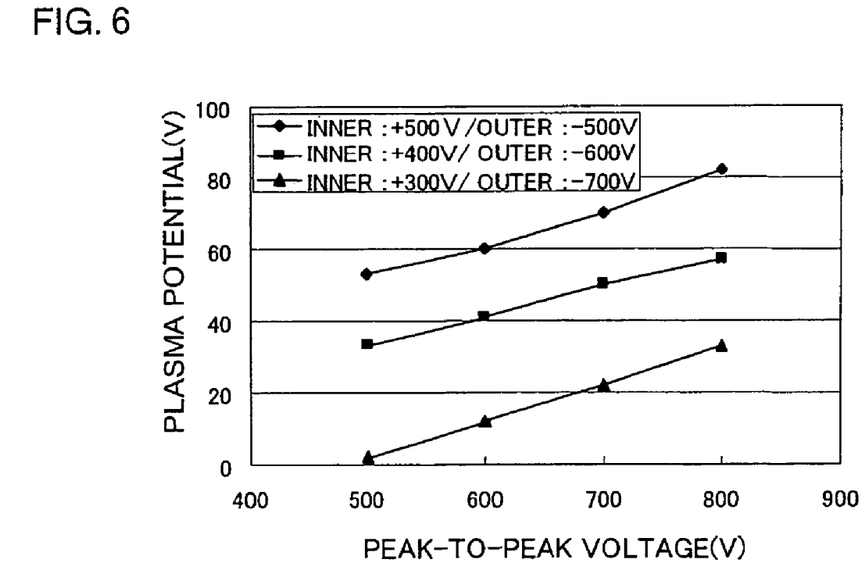
FIG. 6 shows an example measurement of plasma potential versus peak-to-peak voltage parameterized by voltages applied to inner and outer electrodes measured in the apparatus shown in FIG. 4.

Next, the power (peak-to-peak voltage) of the RF power supply 115 applied to the sample stage 108 was varied to measure the plasma potential versus the peak-to-peak voltage of the RF power supply 115. Measurements revealed that, as shown in FIG. 6, the plasma potential tends to be higher as the peak-to-peak voltage increases. As can be seen from FIG. 6, the value of the chuck voltage appropriate for suppressing the abnormal discharge due to the increase of plasma potential depends on the value of the peak-to-peak voltage. It was found from experiments that the plasma potential can be held down below 50 V and abnormal discharge can be avoided with a sufficient margin when the chuck voltages have a value shifted to negative by about one third of the value of the peak-to-peak voltage relative to reference chuck voltages. For example, when the reference chuck voltages are +500 V (inner) and -500 V (outer) and the peak-to-peak voltage is 600 V, the chuck voltages were shifted to negative by 200 V to be +300 V (inner) and -700 V (outer).

The above apparatus was provided with a control circuit capable of changing the positive and negative chuck voltages in association with the peak-to-peak voltage to conduct experiments on suppression of abnormal discharge. In this assessment, HBr and $O_2$ gases were introduced into the vacuum container 110. The power of the RF power supply 101 was set to 500 W, and the power of the RF power supply 115 applied to the sample stage was increased so that the peak-to-peak voltage may increase in the range from about 500 V to 1000 V. Observation was made through the view port 117 to determine whether there is any abnormal discharge. The result was that any abnormal discharge was not observed within the above range of peak-to-peak voltages when the electrostatic chuck voltages were shifted to negative by quarter to half of the peak-to-peak voltage value immediately after the beginning of discharge.

Figure 7:
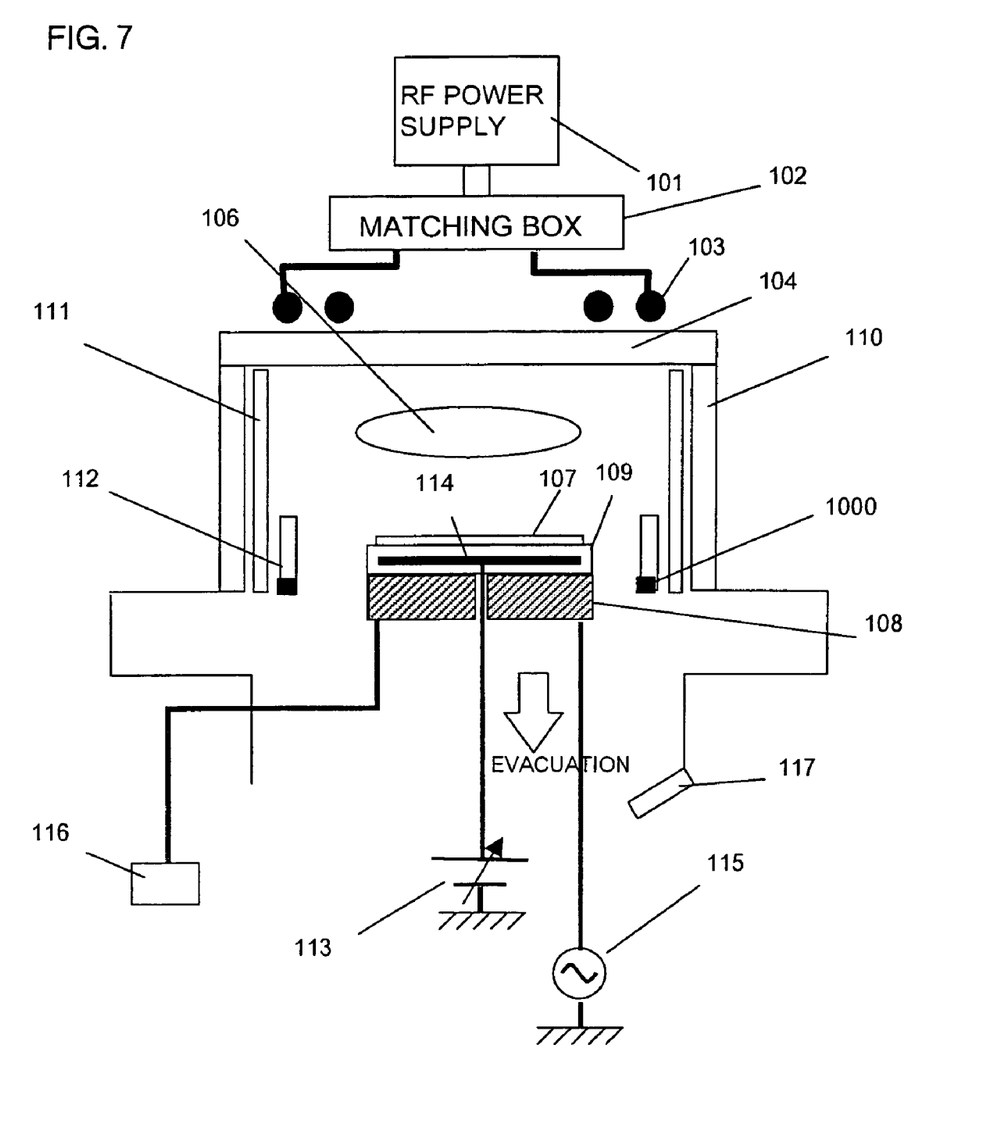
FIG. 7 is a detailed view of a plasma processing apparatus of a third embodiment of the invention.

Next, a third embodiment of the invention will be described. FIG. 7 is a detailed view of a plasma generator of the plasma processing apparatus to which a third embodiment of the invention is applied. The plasma generating means in this embodiment is the same as that shown in FIG. 1 or 4. For example, the sample stage 108 for mounting a sample 107 having a diameter of 200 mm or 300 mm has one or more electrodes in the monopole or dipole configuration described with reference to FIG. 1 or 4.

The third embodiment is characterized in that a DC conductive member is placed in the vacuum container (reactor) 110. This conductive member must be corrosion resistant in plasma of corrosive gas such as $Cl_2$, HBr, and $CF_4$, and free from heavy metal contamination. In this embodiment, for example, a conductive member 1000 made of sintered SiC ceramics in a ring shape is placed at a lower portion in the reactor.

The conductive member 1000 should be placed at a location where plasma density is relatively high. Locations out of reach of plasma such as an extremely lower portion in the reactor are not appropriate. The member should have a sufficient area for accommodating leak current from the plasma 106. Experimentally, the area should be above 50 $cm^2$. The conductive member 1000 preferably has a resistance below 1 kΩ, and does not need to be a good conductor.

Figure 8:
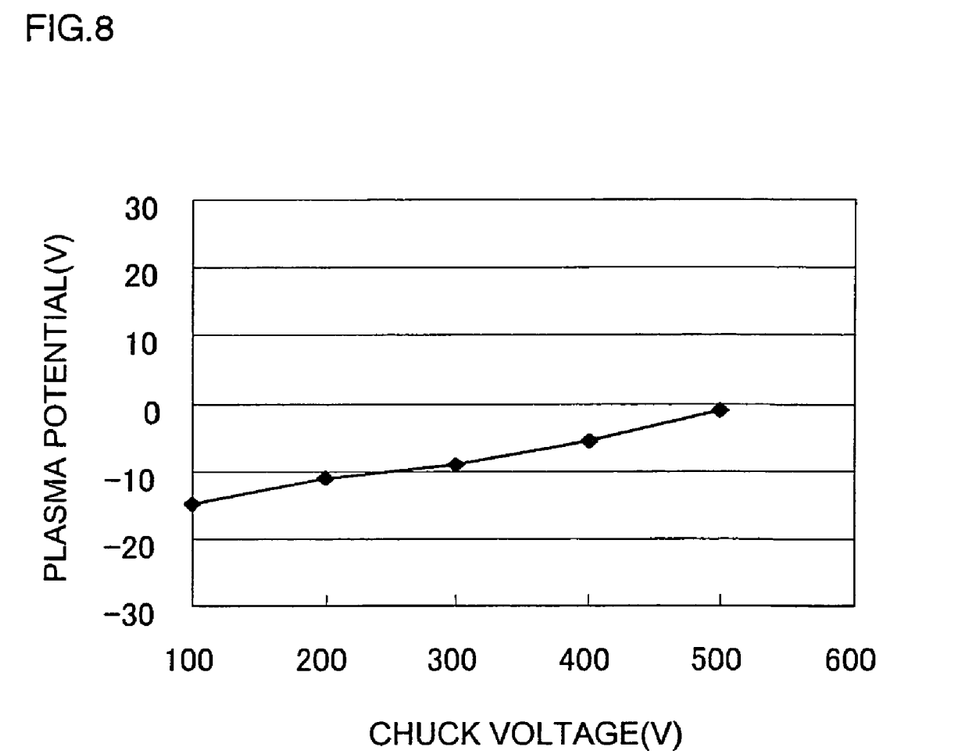
FIG. 8 shows an example measurement of plasma potential versus chuck voltage measured in the apparatus shown in FIG. 7.

FIG. 8 shows the result of experiments in which the conductive member 1000 is introduced into the reactor. Whatever value of the electrostatic chuck voltage may be selected for operation, introducing the conductive member prevents plasma potential from causing abnormal discharge, as compared to the case without introducing the conductive member.

In this embodiment, an inductively coupled plasma processing apparatus using HBr and $O_2$ gases is described by way of example. It is understood, however, that this technology is applicable to processing apparatus for reactive ion etching, magnetron etching, inductively coupled plasma etching, and the like, regardless of gas species and discharge type of the plasma.

What is claimed is:

1. A plasma processing method for a plasma processing apparatus including a first RF source for generating plasma in a vacuum container having an insulating member lining an inner wall surface,
   a sample stage having a dielectric coating surrounding at least one electrostatic chuck electrode placed on an upper portion of the sample stage, for electrostatic chucking a sample, a second RF source for applying an RF bias power for the sample on the sample stage; and
   a DC power supply for applying at least one electrostatic chuck voltage to the at least one electrostatic chuck electrode within the dielectric coating,
   the method comprising:
   varying the at least one electrostatic chuck voltage to negative in accordance with application of the RF bias power, for suppressing increase of plasma potential of the plasma.

2. A plasma processing method according to claim 1, wherein
   the at least one electrostatic chuck voltage is shifted to negative by a potential difference of quarter to half of a peak-to-peak voltage of the RF bias power.

3. A plasma processing method according to claim 1, wherein
   the at least one electrostatic chuck voltage is shifted to negative by a potential difference of quarter to half of a peak-to-peak voltage of the RF bias power; and
   the at least one electrostatic chuck voltage is shifted according to a monitored result of the peak-to-peak voltage of the RF bias power or a recipe setting of a voltage shift.

4. A plasma processing method according to claim 1, wherein
   the at least one electrostatic chuck electrode at the sample stage is in one of a monopole configuration and a dipole configuration.

5. A plasma processing method according to claim 1, wherein
   the at least one electrostatic chuck electrode at the sample stage is in one of a monopole configuration and a dipole configuration; and
   when the at least one electrostatic chuck electrode is in the dipole configuration, the at least one electrostatic chuck voltage is shifted to negative by 50 to 500 V for both electrodes, and
   when the at least one electrostatic chuck electrode is in the monopole configuration, the at least one electrostatic chuck voltage is shifted to negative by 50 to 500 V.

6. A plasma processing apparatus comprising:
   a first RF source for generating plasma in a vacuum container having an insulating member lining an inner wall surface;
   a sample stage having a dielectric coating including at least one electrostatic chuck electrode placed on an upper portion of the sample stage for electrostatic chucking of a sample;
   a second RF source for applying an RF bias power for a sample on the sample stage;
   a DC power supply for applying at least one electrostatic chuck voltage to the at least one electrostatic chuck electrode within the dielectric coating; and
   a controller for varying the at least one electrostatic chuck voltage to negative in accordance with application of the RF bias power, for suppressing increase of plasma potential of the plasma.

7. A plasma processing apparatus according to claim 6, wherein
   the controller controls the at least one electrostatic chuck voltage so that the at least one electrostatic chuck voltage is shifted to negative by a potential difference of quarter to half of a peak-to-peak voltage of the RF bias power.

8. A plasma processing apparatus according to claim 6, wherein
   the controller controls the at least one electrostatic chuck voltage so that the at least one electrostatic chuck voltage is shifted to negative by a potential difference of quarter to half of a peak-to-peak voltage of the RF bias power; and
   the controller shifts the at least one electrostatic chuck voltage according to a monitored result of the peak-to-peak voltage of the RF bias power or a recipe setting of a voltage shift.

9. A plasma processing apparatus according to claim 6, wherein
   the at least one electrostatic chuck electrode at the sample stage is in one of a monopole configuration and a dipole configuration.

10. A plasma processing apparatus according to claim 6, wherein
    the at least one electrostatic chuck electrode at the sample stage is in one of a monopole configuration and a dipole configuration; and
    when the at least one electrostatic chuck electrode is in the dipole configuration, the controller shifts the at least one electrostatic chuck voltage to negative by 50 to 500 V for both electrodes, and
    when the at least one electrostatic chuck electrode is in the monopole configuration, the controller shifts the at least one electrostatic chuck voltage to negative by 50 to 500 V.

11. A plasma processing method according to claim 1, comprising:

varying the at least one electrostatic chuck voltage to negative in relation to a value of a peak-to-peak voltage of the RF bias power, for suppressing increase of plasma potential of the plasma.

12. A plasma processing apparatus according to claim 6, comprising:

the controller for varying the at least one electrostatic chuck voltage to negative in relation to a value of a peak-to-peak voltage of the RF bias power, for suppressing increase of plasma potential of the plasma.

* * * * *